(12) United States Patent
Jeon et al.

(10) Patent No.: US 7,442,272 B2
(45) Date of Patent: Oct. 28, 2008

(54) APPARATUS FOR MANUFACTURING SEMICONDUCTOR DEVICE

(75) Inventors: Jeong-sic Jeon, Kyungki-do (KR); Jin Hong, Kyungki-do (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 327 days.

(21) Appl. No.: 10/875,950

(22) Filed: Jun. 25, 2004

(65) Prior Publication Data

US 2004/0231797 A1    Nov. 25, 2004

Related U.S. Application Data

(62) Division of application No. 10/003,412, filed on Dec. 6, 2001, now Pat. No. 6,833,050.

(30) Foreign Application Priority Data

May 3, 2001    (KR) .................................. 01-24045

(51) Int. Cl.
   *C23C 16/00*   (2006.01)
   *C23F 1/00*    (2006.01)
   *H01L 21/306*  (2006.01)
(52) U.S. Cl. ............................. 156/345.48; 156/345.36; 156/345.41; 118/723 I; 118/723 ME; 118/723 ER
(58) Field of Classification Search ............... 118/723 I; 156/345.48
   See application file for complete search history.

(56) References Cited

U.S. PATENT DOCUMENTS

| | | | |
|---|---|---|---|
| 5,614,055 A * | 3/1997 | Fairbairn et al. | 156/345.33 |
| 5,643,394 A | 7/1997 | Maydan et al. | |
| 5,690,781 A | 11/1997 | Yoshida et al. | |
| 5,746,875 A | 5/1998 | Maydan | |
| 6,076,482 A | 6/2000 | Ding et al. | |
| 6,085,688 A | 7/2000 | Lymberopoulos et al. | |
| 6,129,806 A * | 10/2000 | Kaji et al. | 156/345.46 |
| 6,296,747 B1 | 10/2001 | Tanaka | |
| 6,299,746 B1 | 10/2001 | Conte et al. | |
| 6,475,335 B1 * | 11/2002 | Yin et al. | 156/345.48 |

FOREIGN PATENT DOCUMENTS

EP    0 820 087 A2    1/1998

(Continued)

*Primary Examiner*—Parviz Hassanzadeh
*Assistant Examiner*—Rakesh K Dhingra
(74) *Attorney, Agent, or Firm*—Lee & Morse, P.C.

(57) ABSTRACT

An apparatus for improving the density and uniformity of plasma in the manufacture of a semiconductor device features a plasma chamber having a complex geometry that causes plasma density to be increased at the periphery or edge of a semiconductor wafer being processed, thereby compensating for a plasma density that is typically more concentrated at the center of the semiconductor wafer. By mounting a target semiconductor wafer in a chamber region that has a cross-sectional area that is smaller than a cross-sectional area of a plasma source chamber region, a predetermine flow of generated plasma from the source becomes concentrated as it moves toward the semiconductor wafer, particularly at the periphery of the semiconductor wafer. This provides a more uniform plasma density across the entire surface of the target semiconductor wafer than has heretofore been available.

19 Claims, 3 Drawing Sheets

FOREIGN PATENT DOCUMENTS

| | | |
|---|---|---|
| JP | 07-022388 | 1/1995 |
| JP | 07-029890 | 1/1995 |
| JP | 09-181049 | 7/1997 |
| JP | 09-186140 | 7/1997 |
| JP | 10-072669 | 3/1998 |
| JP | 10-083987 | 3/1998 |
| JP | 11-219914 | 8/1999 |
| JP | 2000-73175 | 3/2000 |
| WO | WO 01/11659 A1 | 2/2001 |

* cited by examiner

APPARATUS FOR MANUFACTURING SEMICONDUCTOR DEVICE

This application is a Division of application Ser. No. 10/003,412, filed Dec. 6, 2001 now U.S. Pat. No.6,833,050.

BACKGROUND OF THE INVENTION

1. Field of the Invention

The present invention relates to an apparatus for manufacturing a semiconductor device, and more particularly, to an apparatus for manufacturing a semiconductor device with improved uniformity of plasma density.

2. Description of the Related Art

Apparatuses for manufacturing semiconductor devices can be classified as an apparatus for forming a thin film on a semiconductor substrate, an apparatus for performing a photolithography process to form a mask pattern on the thin film to form fine patterns, an apparatus for etching the thin film using the mask pattern as an etching mask to form fine patterns, and an apparatus for implanting impurity ions into the semiconductor substrate. As the line width of patterns is reduced due to increased integration density of semiconductor devices, the quality and capabilities of etching apparatuses and deposition apparatuses used for forming fine patterns become more important. Etching apparatuses are typically classified as either dry etching apparatuses, such as plasma etching apparatuses, and wet etching apparatuses. As the integration density of semiconductor devices increases, dry etching apparatuses, which enable anisotropic etching to be performed, are typically used, and apparatuses adopting a chemical vapor deposition method using plasma, e.g., plasma-enhanced chemical vapor deposition (PE-CVD), are used as deposition apparatuses.

FIGS. 1A and 1B show two-dimensional views of apparatuses for manufacturing a semiconductor device according to the prior art. FIG. 1A shows an induced coupled plasma etching apparatus 10 having a dielectric plane structure, and FIG. 1B shows an induced coupled plasma etching apparatus 40 having a dielectric dome structure. For illustrative convenience, it is considered that chambers 12 and 42 are cylindrical, lower electrodes 26 and 56 are circular plates, an insulating plate 20 shown in FIG. 1A is circular, and an insulating plate 50 shown in FIG. 1B is dome-shaped. A plurality of induction coils 14 shown in FIG. 1A for generating a plasma source span a distance that is substantially equal to the diameter L1 of the insulating plate 20. Similarly, a plurality of induction coils 44 shown in FIG. 1B span a distance that is substantially equal to the length of curved surface of the insulating plate 50. The insulating plate 20 and the lower electrode 26 shown in FIG. 1A have almost the same diameters L1 and L2, and the projected diameter L4 of the curved surface of the insulting plate 50 shown in FIG. 1B is designed to be substantially equal to the diameter L5 of the lower electrode 56. The diameters of wafers 30 and 60 supported by static chucks 28 and 58 that are mounted on the lower electrodes 26 and 56 are designed to be smaller than the diameters of the lower electrodes 26 and 56. Confinement layers 22 and 52, which confine plasma regions 24, 54a, and 54b, are designed to contact the edges of the insulating plates 20 and 50 and extend in a direction that is perpendicular to the lower electrodes 26 and 56.

Referring to FIGS. 1A and 1B, insulating layers or conductive layers are deposited on the wafers 30 and 60 and then etched to obtain desired patterns.

A low-frequency power supplied from first power supplies 16 and 46 is applied to a plurality of induction coils 14 and 44 to generate a magnetic flux. Inductance of coils 14 and 44 creates an electric field and a magnetic field in a plasma region 24, 54a, and 54b via the insulating plates 20 and 50 included in the chambers 12 and 42. Here, a high-frequency external power is supplied to the lower electrodes 26 and 56 via second power supplies 18 and 48. Electrons move due to the magnetic field and the electric field in the plasma regions 24, 54a, and 54b and are accelerated to bombard a reactive gas to generate reactive ions of plasma. The reactive ions are diffused/absorbed into objects to be etched on the wafers 30 and 60.

Since plasma (or reactive ions) is incident to the center of the wafers 30 and 60 and diffused into the sides of the wafers 30 and 60, plasma density at the center of the wafers 30 and 60 is higher than plasma density at the edge of the wafers 30 and 60. Thus, since a large amount of plasma is incident to the center of wafers 30 and 60, patterns positioned at the center of the wafers 30 and 60 are over-etched. Since a small amount of reactive ions is diffused/absorbed at the edge of the wafers 30 and 60, patterns positioned at the edge of the wafers 30 and 60 are under-etched. Since the under-etched or over-etched patterns can greatly affect a subsequent process and/or the characteristics of the semiconductor device, it is important to maintain uniformity of etching throughout a wafer.

The above-described non-uniformity of plasma density occurs in deposition apparatuses as well as etching apparatuses. The thickness of a pattern formed at the edge of a wafer is thinner than the thickness of a pattern formed at the center of the wafer, and thus uniformity of the patterns is not ensured.

In order to meet semiconductor users' demand for high added value as well as low price, the price of semiconductor devices is typically lowered by manufacturing a large number of chips in a single process, i.e., using large diameter of wafers. Wafers having a diameter of 200 mm are typically used for producing most advanced semiconductor devices, such as memories and logics. However, it is expected that semiconductor devices will soon be mass-produced using wafers having diameters of 300 mm.

The differences in plasma density at different locations on a wafer becomes more pronounced for such larger-diameter wafers. A variety of techniques for correcting non-uniformity of plasma density have been proposed for wafers having a diameter of 200 mm, but these fail to adequately ensure etching uniformity and deposition uniformity when processing wafers having a diameter of 300 mm. Further, since plasma density is low at the edge of wafers, etch rate or deposition rate necessary for forming patterns at the edge of the wafers according to a design is not typically attained.

Accordingly, the semiconductor industry requires a technique by which a high plasma density region is formed on a wafer having a large diameter (i.e. over 200 mm and 300 mm) in order to obtain uniform etching and/or deposition throughout the wafer.

SUMMARY OF THE INVENTION

To solve the above-described problems, it is a feature of the present invention to provide an apparatus for manufacturing a semiconductor device with improved uniformity of plasma density throughout.

It is another feature of the present invention to provide an apparatus for manufacturing a semiconductor device having improved effective plasma density.

Accordingly, there is provided an apparatus for manufacturing a semiconductor device using plasma. The apparatus includes a chamber for performing a manufacturing process on the semiconductor device under a plasma atmosphere and a device installed in the chamber for concentrating the plasma. The device reduces the size of a plasma region near an object to be processed as compared to the size of a plasma region near a part of the chamber where the plasma is generated. The device for concentrating the plasma includes: a lower electrode having a first length on which the object to be processed is positioned; an insulating plate having a second length that is longer than the first length and that is separated from and facing the lower electrode; and a confinement layer contacting the edge of the insulating plate, forming an acute angle to a virtual plane connecting opposing ends of the insulating plate, and extending toward the edge of the lower electrode. The diameter of the circular plate is the first length if the lower electrode is a circular plate. Here, the acute angle is preferably 45-89 degrees.

In more detail, the insulating plate includes a first part having a first radius of curvature and a second part having a second radius of curvature which is smaller than the first radius of curvature, and the edge of the second part of the insulating plate is connected to the confinement layer. The insulating plate may have a dome shape having a predetermined radius of curvature. The insulating plate may be a circular plate. Here, the second length is the diameter of the circular plate.

The device for concentrating plasma preferably includes: a lower electrode having a first length; an insulating plate having a dome shape, which is oriented to face the lower electrode and includes a first part having a first radius of curvature and a second part having a second radius of curvature which is smaller than the first radius of curvature; and a confinement layer connected to the second part of the insulating plate and extending toward the lower electrode. Here, a second length, which is the projected length of the insulating plate, is larger than the first length. The confinement layer is substantially perpendicular to the projected surface of the insulting plate.

The apparatus for manufacturing a semiconductor device further preferably includes a chuck for supporting a wafer having a third length and preferably being located above the lower electrode. The wafer is preferably a circular plate, and thus the third length becomes the diameter of the wafer. The diameter or projected length of the insulating plate is preferably over about 140% of such a third length. The length of the bottom of the confinement layer is preferably over about 120% of such a third length. The distance from the edge of the confinement layer to the edge of the wafer is preferably about 10-15% of the third length.

For an exemplary wafer having a diameter of 300 mm, a corresponding second length of the insulating plate would be approximately 420 mm and the diameter of the bottom edge of the confinement layer would be approximately 360 mm.

Although the preceding confinement layer is described as a perpendicular element and is distinguished from the sidewall of the chamber, the confinement layer may constitute the sidewall of the chamber and may be slanted.

The apparatus for manufacturing a semiconductor device further includes a device for generating plasma in a plasma region of the chamber. The device for generating plasma may include a first power supply connected to a plurality of induction coils and a second power supply connected to the lower electrode where an object to be processed is positioned. The device for generating plasma may be an integral part of the chamber, or it can be located external to the chamber with the plasma being introduced into the chamber by other means.

Another embodiment of the present invention for increasing plasma density at the edges of a semiconductor device during a plasma-etch manufacturing process, comprises: a first chamber for generating a plasma and a second chamber, wherein the semiconductor device is positioned; and characterized in that the second chamber has a smaller cross-sectional area than the first chamber. The embodiment preferably includes a plurality of induction coils for generating the plasma in the first chamber and an electrode for attracting the plasma into the second chamber.

Another embodiment of the present invention for improving the uniformity of a plasma density at a semiconductor device in a plasma-etch manufacturing process, comprises: a first chamber, wherein a plasma is generated; and a second chamber, wherein the semiconductor device is positioned; and characterized in that the second chamber has a smaller cross-sectional area than the first chamber. The embodiment preferably includes a plurality of induction coils for generating the plasma in the first chamber and an electrode for attracting the plasma into the second chamber.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE INVENTION

Figure 1A:
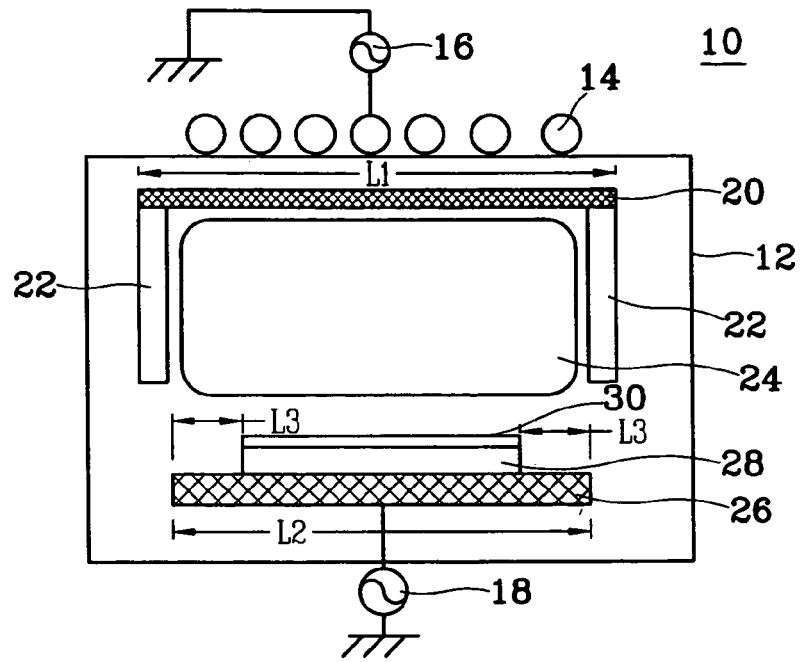
FIGS. 1A and 1B illustrate schematic diagrams of the structure of an apparatus for manufacturing a semiconductor device according to the prior art.

Korean Patent Application No. 01-24045, filed on May 3, 2001, and entitled: "Apparatus for Manufacturing Semiconductor Device," is incorporated by reference herein in its entirety.

Hereinafter, the present invention will be described in detail with reference to the attached drawings.

The apparatuses of the present invention increase effective plasma density and concentrate plasma density at the edge of the wafer, which heretofore would have a relatively lower plasma density than at the center of the wafer. A principal feature of the preferred embodiments of the present invention is that a plasma region in a vacuum chamber must be larger at a location where the plasma is introduced than at a location where an object to be treated on a lower electrode is positioned.

For illustrative convenience, although the figures illustrate two dimensional representations, it is considered that in all of the embodiments that the chambers are preferably cylindrical in shape, and that the lower electrodes and insulating plates are circular planar elements within those cylindrical shapes. Reference to the lengths of different elements are also meant to refer to the diameters when such elements are circular. For non-circular chambers, references relating to lengths may also be used to describe depth into the plane of the drawing. It should also be understood that references to upper and lower are for illustration purposes only, and not meant to be limiting, since plasma migration is a function of an electrical field rather than gravity, thereby having applicability to a chamber having any orientation.

Figure 2:
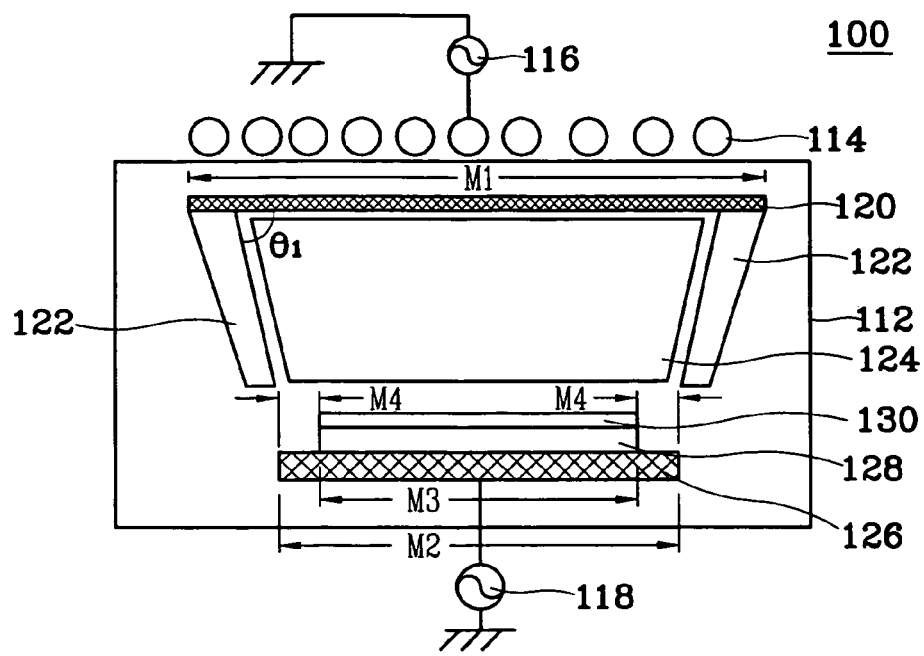
FIG. 2 illustrates a schematic diagram of an apparatus for manufacturing a semiconductor device according to a first embodiment of the present invention.

FIG. 2 shows an apparatus for manufacturing a semiconductor device according to a first preferred embodiment of the present invention. Referring to FIG. 2, an apparatus 100 for manufacturing a semiconductor device preferably includes a vacuum chamber 112, a plurality of induction coils 114 mounted on the vacuum chamber 112, a first power supply 116 for supplying the plurality of induction coils 114 with low frequency power, and a second power supply 118 for supplying a lower electrode 126 with high-frequency power. A chuck 128 for supporting a wafer 130 is preferably positioned on the lower electrode 126. Plasma generated from the plurality of induction coils 114 may be introduced into the vacuum chamber 112 via a plurality of holes (not shown) that are formed in an insulating plate 120. The diameter of the insulating plate 120 is M1, which corresponds to the distance spanned by the plurality of induction coils 114. The wafer 130 may have a predetermined diameter M3 and be positioned a predetermined distance M4 from a confinement layer 122 to allow etching by-products to be exhausted via the spaced portion.

There are significant differences between the apparatus shown in FIG. 1A and the apparatus shown in FIG. 2. First, the diameter M2 of the lower electrode 126 shown in FIG. 2 is preferably smaller than the diameter M1 of the insulating plate 120 of FIG. 2. Second, in the vacuum chamber 112 of FIG. 2, the confinement layer 122, which contacts the edge of the insulating plate 120 and extends toward the lower electrode 126, is preferably not perpendicular to the insulating plate 120, rather it preferably forms an acute angle $\theta_1$ to the insulating plate 120. For example, it is preferable that the acute angle $\theta_1$ of the confinement layer 122 be in the range of 45-89 degrees. Accordingly, since the insulating plate 120 and the lower electrode 126 shown in FIG. 2 are circular plates, the confinement layer 122 has a cylindrical shape, the diameter of which is reduced at an end closer to the lower electrode 126. A resulting plasma region 124 has the same shape as the confinement layer 122, i.e., cylindrical. Thus, when compared to an apparatus adopting a confinement layer 22 that is perpendicular to the lower electrode 26 shown in FIG. 1, the apparatus of the present invention produces slight plasma density increases near the edge of the wafer 130, but not near the center of the wafer 130. This produces an overall uniform plasma density on the wafer 130.

For a wafer 30 shown in FIG. 1A having a diameter identical to the diameter M3 of the wafer 130 shown in FIG. 2, the diameter M1 of the insulating plate 120 shown in FIG. 2 would preferably be larger than the diameter L1 of an insulating plate 20 in FIG. 1A. Thus, the distance spanned by the plurality of induction coils 114 shown in FIG. 2 would be greater than distance spanned by the plurality of induction coils 14 shown in FIG. 1A.

The distance spanned by the plurality of induction coils 114 and the diameter M1 of the insulating plate 120 is preferably over 140% of the diameter M3 of the wafer 130 to be etched and preferably over 120% of the diameter M2 of the lower electrode 126. The distance M4 between the edge of the lower electrode 126 and the edge of the wafer 130 is preferably designed to be 10-15% of the diameter M3 of the wafer 130. For example, for a wafer 130 having a diameter M3 of 300 mm, the diameter M1 of the insulating plate 120 would be approximately 420 mm and the diameter M2 of the lower electrode 126 would be approximately 360 mm. The exemplary distance M4 between the edge of the lower electrode 126 and the edge of the wafer 130 would be 30-45 mm.

According to the above-described embodiment, even though the first and second power supplies, 116 and 118, respectively, do not increase the power and pressure in the vacuum chamber 112, the cross-sectional area of the plasma region 124, which is defined by the cylindrical confinement layer 122, is smaller near the wafer 130 than near the insulating plate 120. This effectively increases the usable plasma density of a given amount of plasma generated, and substantially increases the plasma density near the edge of the wafer. Thus, the uniformity of the distribution of plasma throughout the wafer is improved, thereby producing a uniform etch rate for the patterns.

The distance spanned by the plurality of induction coils 114 that generate plasma increases with an increase in the diameter M1 of the insulating plate 120. Since the magnetic flux generated by the plurality of induction coils 114 shown in FIG. 2 is greater than the magnetic flux generated by the plurality of induction coils 14 shown in FIG. 1A, high density plasma can be obtained using the embodiment shown in FIG. 2 over that shown in FIG. 1.

Figure 1B:
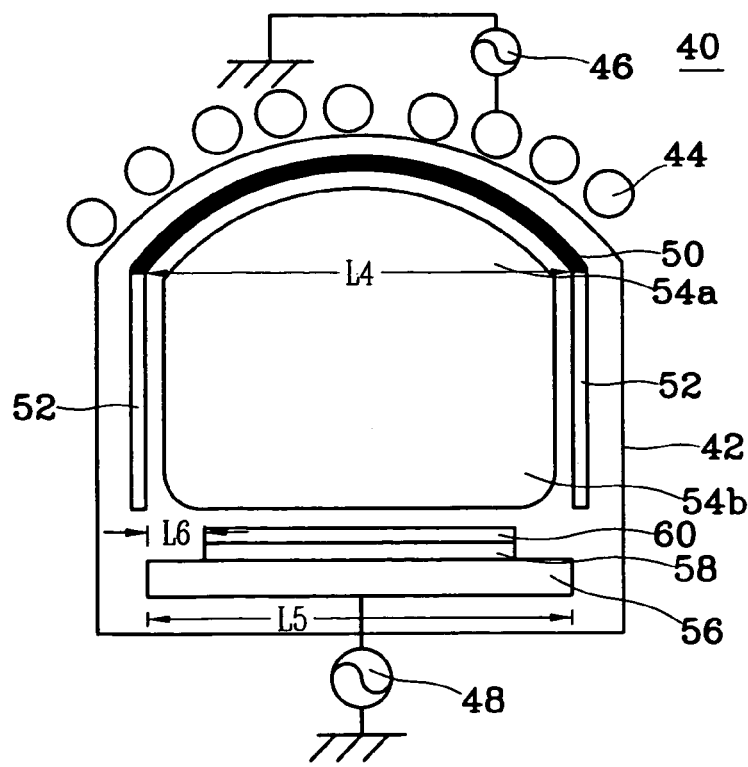
Figure 3:
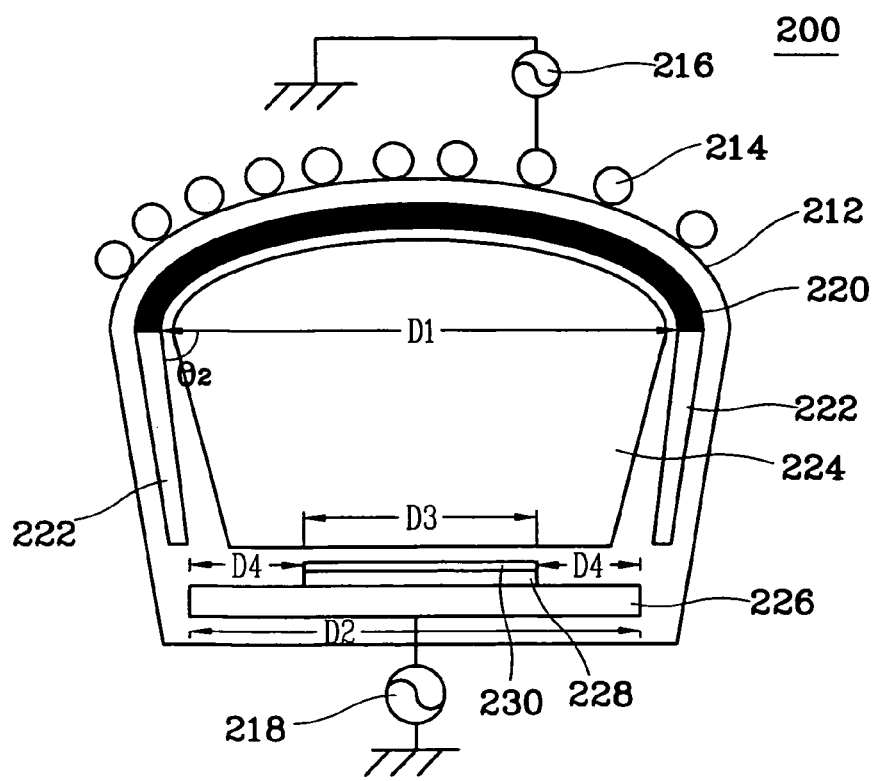
FIG. 3 illustrates a schematic diagram of an apparatus for manufacturing a semiconductor device according to a second embodiment of the present invention.
Figure 4:
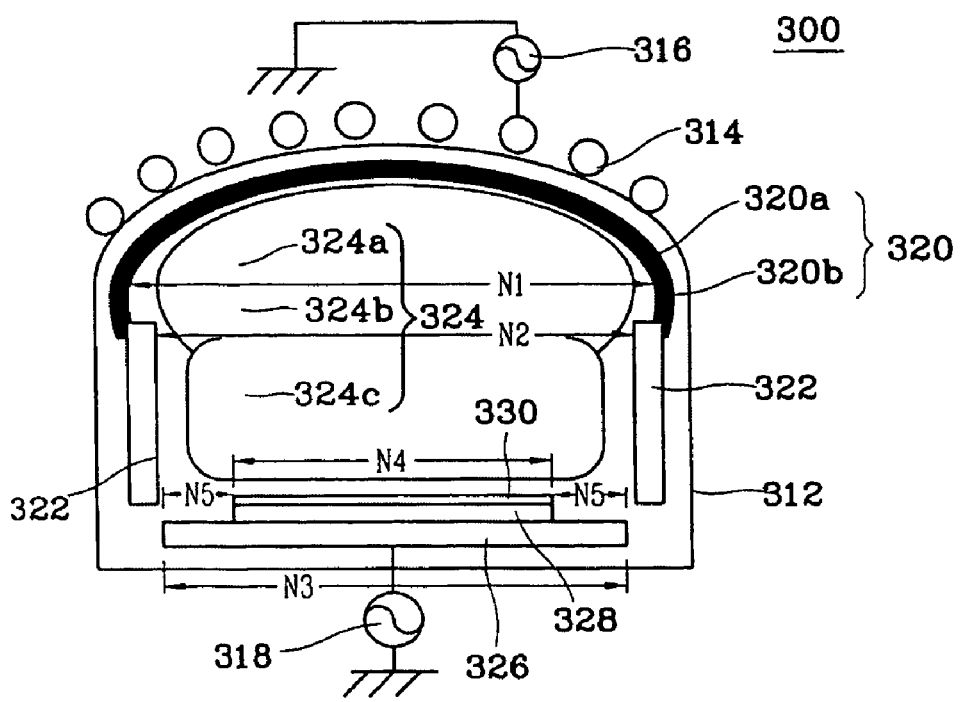
FIG. 4 illustrates a schematic diagram of an apparatus for manufacturing a semiconductor device according to a third embodiment of the present invention.
Figure 5:
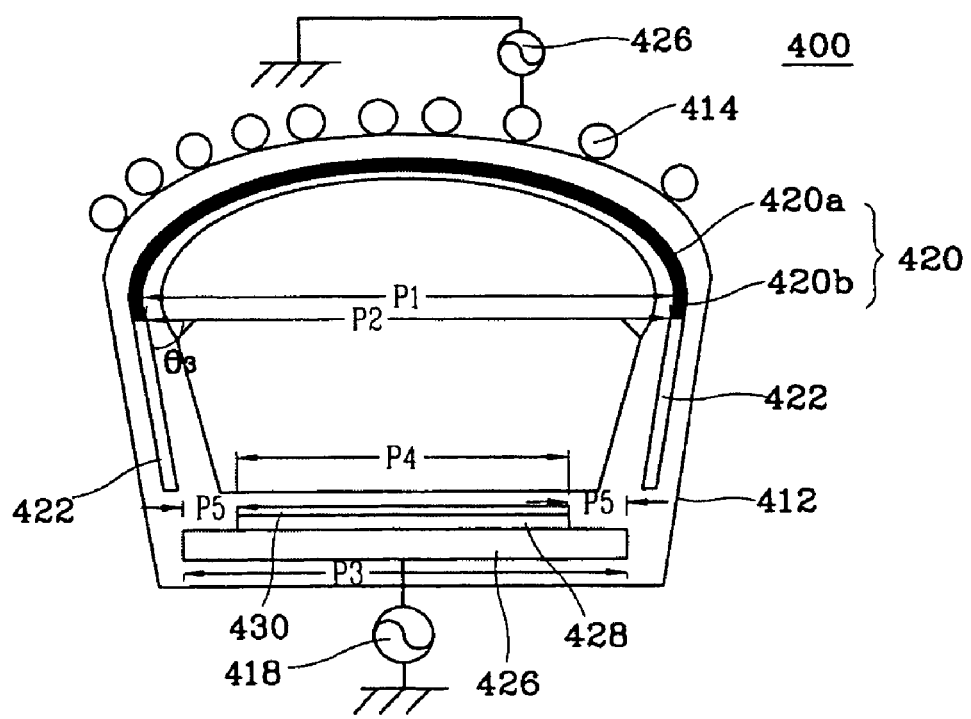
FIG. 5 illustrates a schematic diagram of an apparatus for manufacturing a semiconductor device according to a fourth embodiment of the present invention.

Second, third, and fourth embodiments of a plasma etching apparatus of the present invention which are modifications of the plasma etching apparatus shown in FIG. 1B are shown in FIGS. 3, 4, and 5, respectively. Referring to FIG. 3, a chamber 212 preferably has a top that is dome-shaped. An insulating plate 220 may be configured as an upper portion of the chamber 212 that has a dome shape with a predetermined radius of curvature. The radius of curvature of the insulating plate 220 is preferably equal to or greater than the radius of curvature of an insulating plate 50 shown in FIG. 1B. According to the present invention, the projected diameter D1 of the insulating plate 220 is preferably greater than the diameter D2 of a lower electrode 226.

For a wafer 230 having a diameter identical to wafer 60 shown in FIG. 1B, the projected diameter D1 of the insulating plate 220 would be made to be greater than the projected diameter L4 of an insulating plate 50 shown in FIG. 1B. Thus, the distance spanned by a plurality of induction coils 214 located on the outer surface of the dome-shaped chamber 212 is greater than the distance spanned by a plurality of induction coils 44 shown in FIG. 1B. The plurality of induction coils 214 generate more magnetic flux, and thus more plasma, than the plurality of induction coils 44 of FIG. 1B even when the amount of power supplied by a first power supply 216 is equal to the amount of power supplied by a first power supply 46 shown in FIG. 1B.

As described above, the projected diameter of D1 of the insulating plate 220 is greater than the diameter D2 of the lower electrode 226. Like FIG. 2, a confinement layer 222 contacts the edge of the dome-shaped insulating plate 220 and extends toward the wafer 230, forming an acute angle $\theta_2$ to the projected surface of the insulating plate 220. Thus, plasma density in a plasma region 224 increases in a direction toward the wafer 230, and in particular, plasma density in a plasma region 224 increases significantly near the edge of the wafer 230. As a result, high-density plasma is obtained and the uniformity of etching throughout the wafer 230 is improved.

Reference numbers 218 and 228 indicate a power supply having a high frequency and a chuck for supporting the wafer 230, respectively. Reference numbers 218 and 228 correspond to reference numbers 118 and 128 shown in FIG. 2. D4 represents the distance from the wafer 230 to the confinement layer 222 or the edge of the lower electrode 226 and corresponds to M4 shown in FIG. 2.

For example, an acute angle $\theta_2$ may be within the range of about 45-89 degrees. The distance spanned by the plurality of induction coils 214 and the projected diameter D1 the insulating plate 220 is preferably over about 140% of the diameter D3 of the wafer 230 and preferably over about 120% of the diameter D2 of the lower electrode 226. The exemplary distance D4 from the edge of the lower electrode 226 to the edge of the wafer 230 would be about 10-15% of the diameter M3 of the wafer 130. For example, for a wafer 230 having a diameter D3 of 300 mm, the diameter D1 of the insulating plate 220 would be approximately 420 mm and the length D2 of the lower electrode 226 would be approximately 360 mm, and D4 would be approximately 30-45 mm.

Reference numbers 312, 314, 316, 318, 326, 328, and 330 in FIG. 4 denote the same members as reference numbers 212, 214, 216, 218, 226, 228, and 230, respectively, in FIG. 3. In the embodiment shown in FIG. 4, plasma is concentrated by adjusting the radius of curvature of a dome-shaped insulating plate 320 rather than by adjusting a slanted confinement layer as shown in FIGS. 2 and 3. The dome-shaped insulating plate 320 is divided into two parts, wherein a first part 320a preferably has a relatively larger radius of curvature with a second part 320b having a relatively smaller radius of curvature. Thus, the projected diameter N1 of the first part 320a is greater than the projected diameter N2 of the second part 320b. The projected diameter N2 of the second part 320b denotes the projected diameter of the dome-shaped insulating plate 320. The projected diameter N2 of the second part 320b may be designed to be substantially equal to the diameter N3 of a lower electrode 326. Here, the radius of curvature or the projected diameter N2 of the second part 320b may be determined by the diameter N4 of a wafer 330, the distance N5 from the wafer 330 to a confinement layer 322, and the height of the confinement layer 322.

The radius of curvature of the first part 320a may be designed to be equal to the radius of curvature of the insulating plate 220 shown in FIG. 3 (i.e., the projected diameter N1 of the first part 320a is equal to D1 in FIG. 3.) Since the radius of curvature of the second part 320b is less than the radius of curvature of the first part 320a, the projected diameter N2 of the second part 320b is reduced. Thus, plasma density of a second plasma region 324b defined by the second part 320b increases more than the plasma density of a first plasma region 324a defined by the first part 320a. In particular, plasma density increases at the edge of the second plasma region 324b more than at the center of the second plasma region 324b.

The confinement layer 322, which extends from the edge of the second part 320b to the wafer 330, may be perpendicular to the projected surface of the second part 320b. The projected diameter N2 of the second part 320b denotes the projected diameter of the insulating plate 320. Thus, plasma density in the plasma region 324b is maintained in a plasma region 324c.

Similar to the embodiments shown in FIGS. 2 and 3, a distance spanned by a plurality of induction coils 314 increases with an increase in the length of the curved surface of the insulating plate 320, thereby resulting in an increased amount of plasma generated by the plurality of induction coils 314 without varying power and/or pressure.

For example, if the projected diameter N1 of the first part 320a is designed to be over about 140% of the diameter N4 of the wafer 330, the projected diameter N2 of the second part 320b or the diameter N3 of the lower electrode 326 may be designed to be over about 120% of the diameter N4 of the wafer 330. The distance N5 from the edge of the wafer 330 to the edge of the lower electrode 326 may be designed to be 10-15% of the diameter N4 of the wafer 330. For example, for a wafer 330 having a diameter of 300 mm, the projected diameter N1 of the first part 320a would be over about 420 mm and the projected diameter N2 of the second part 320b or the diameter N3 of the lower electrode 326 would be over about 360 mm. The exemplary distance N5 from the edge of the wafer 330 to the edge of the lower electrode 326 would be designed to be 30-45 mm.

Reference numerals 412, 414, 416, 418, 426, 428, and 430 in FIG. 5 denote the same members as reference numerals 212, 214, 216, 218, 226, 228, and 230, respectively, in FIG. 3. In an etching apparatus shown in FIG. 5, the radius of curvature of an insulating plate 420 is adjusted to concentrate plasma to a predetermined area, and a confinement layer 422 is preferably slanted at a predetermined angle $\theta_3$ so that plasma is further concentrated to the predetermined area.

A dome-shaped insulating plate 420 includes two parts 420a and 420b, similar to the insulating plate 320 having the two parts 320a and 320b shown in FIG. 4. In other words, the dome-shaped insulating plate 420 preferably includes a first part 420a having a relatively larger radius of curvature P1 and a second part 420b having a relatively smaller radius of curvature P2. The projected diameter of the first part 420a is greater than the projected diameter P2 of the second part 420b or the diameter P3 of the lower electrode 426. The projected diameter P2 of the second part 420b denotes the projected diameter of the dome-shaped insulating plate 420. The confinement layer 422 is connected to the second part 420b, which extends toward the lower electrode 426, preferably forms an acute angle $\theta_3$ to the projected surface of the insulating plate 420.

The relationships between the diameter P4 of a wafer 430, the projected diameter P2 of the second part 420b, the diameter P3 of the lower electrode 426, and the distance P5 from the wafer to the confinement layer 422 and examples thereof may be the same as those described conditions used in the above-described embodiments. The acute angle $\theta_3$ may be the same as the acute angles of the above-described embodiments.

Compared with the etching apparatuses shown in FIGS. 3 and 4, as described above, since plasma is concentrated in two ways, effective plasma density increases and uniformity of plasma density and etch rate throughout a wafer may be further improved. The diameter of a wafer used in the apparatus shown in FIG. 5 may be the same as the diameters of the wafers 230 and 330 used in the apparatuses shown in FIGS. 3 and 4. Also, power used in the apparatus shown in FIG. 5 may be the same as power supplied to the apparatuses shown in FIGS. 3 and 4. However, the projected diameter P1 of the first part 420 shown in FIG. 5 is preferably larger than the projected diameter D1 of the insulating plate 220 shown in FIG. 3 and the projected diameter N1 of the first part 320a shown in FIG. 4. Thus, the distance spanned by a plurality of induction coils 414 mounted on a chamber 412 is further increased, thereby increasing magnetic flux even more. In other words, plasma density may be further increased in this embodiment than in the above-described embodiments.

According to the present invention, a plasma region is preferably made narrower towards a wafer or a processed object than near an insulating plate in order to increase effective plasma density by increasing plasma density at the edge of the wafer. Thus, patterns are formed according to a design, and plasma density may be made uniform near the wafer or the lower electrode, thereby increasing the uniformity of etch rate or deposition rate.

In the above-described embodiments, the power supply 116, 216, 316, or 426 and the plurality of induction coils 114, 214, 314, or 414 are preferably used to generate plasma. However, microwaves, an electron cyclotron resonance source, or a reactive ion etching source may be used instead.

Chambers and confinement layers are described as independent components in these embodiments. But the wall of a chamber where a confinement layer is not installed may serve as a confinement layer. Thus, in this case, the wall of the chamber may be designed to so that it narrows toward an electrode where the wafer is positioned. A cylindrical chamber has been described but the spirit of the present invention must not be interpreted as being restricted to this cylindrical chamber. It is apparent to one of ordinary skill in the art that the spirit of the present invention may be applied to a hexahedral, or other geometrically formed, chamber.

The spirit of the present invention may be applied to an apparatus using plasma where upper and lower electrodes are supplied with power externally, a plasma apparatus where only an upper electrode facing a wafer with an insulating plate that is positioned between the upper electrode and the wafer in a chamber is supplied with power externally, and a magnetic-enhanced reactive ion etching (MERIE) apparatus where only a lower electrode on which a wafer is placed is supplied with power externally.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. An apparatus for manufacturing a semiconductor device using plasma, comprising:
   a chamber having a plasma generating region and a plasma processing region adapted to perform a manufacturing process on the semiconductor device under a plasma atmosphere;
   a plasma generating means adjacent to the plasma generating region; and a plasma concentrating means adapted to reduce a size of the plasma processing region near the semiconductor device to be processed compared to a size of the plasma generating region, wherein the plasma concentrating means including:
   an electrode having a first length on which the semiconductor device to be processed is positioned,
   an insulating plate having a second length longer than the first length and facing the electrode, and
   a confinement layer contacting the edge of the insulating plate, forming an acute angle to a virtual plane connecting opposing ends of the insulating plate, and extending toward an edge of the electrode,
   wherein the insulating plate includes a first part having a first radius of curvature and a second part having a second radius of curvature, which is smaller than the first radius of curvature, and an edge of the second part of the insulating plate being connected to the confinement layer.

2. The apparatus as claimed in claim 1, wherein the plasma generating means is installed outside of the chamber to generate plasma that is introduced into the plasma generating region of the chamber.

3. The apparatus as claimed in claim 2, wherein the plasma generating means comprises a plurality of induction coils mounted on the chamber and a first power supply connected to the plurality of induction coils.

4. The apparatus as claimed in claim 3, wherein the plasma generating means comprises a second power supply connected to the electrode on which the semiconductor device is positioned.

5. The apparatus as claimed in claim 1, wherein the confinement layer is formed of a sidewall of the chamber.

6. An apparatus for manufacturing a semiconductor device using plasma, comprising:
   a chamber having a plasma generating region and a plasma processing region adapted to perform a manufacturing process on the semiconductor device under a plasma atmosphere,
   a plasma generating means adjacent the plasma generating region; and
   a plasma concentrating means adapted to reduce a size of the plasma processing region near the semiconductor device to be processed compared to a size of the plasma generating region, the plasma concentrating means including:
   an electrode having a first length on which the semiconductor device to be processed is positioned,
   an insulating plate having a second length longer than the first length and facing the electrode, and
   a confinement layer contacting an edge of the insulating plate, forming an acute angle to a virtual plane connecting opposing ends of the insulating plate, and extending toward an edge of the electrode,
   wherein the insulating plate has a dome shape having a predetermined radius of curvature, and the second length of the insulating plate being approximately the same as a projected diameter of the insulating plate.

7. The apparatus as claimed in claim 6, further comprising a chuck for supporting a wafer having a third length and disposed on the electrode.

8. The apparatus as claimed in claim 7, wherein the second length is over 140% of the third length.

9. The apparatus as claimed in claim 8, wherein the first length of the electrode is over 120% of the third length.

10. The apparatus as claimed in claim 9, wherein the distance from the edge of the wafer to an associated edge of the electrode is between 10 and 15% of the third length.

11. The apparatus as claimed in claim 9, wherein the second length is approximately 420 mm and the third length is approximately 300 mm.

12. The apparatus as claimed in claim 11, wherein the electrode has a diameter of approximately 360 mm.

13. The apparatus as claimed in claim 6, wherein the acute angle is between 45 and 89 degrees.

14. The apparatus as claimed in claim 6, wherein the confinement layer is formed of a sidewall of the chamber.

15. An apparatus for manufacturing a semiconductor device using plasma, comprising:
   chamber having a plasma generating region and a plasma processing region adapted to perform a manufacturing process on the semiconductor device under a plasma atmosphere;
   a plasma generating means adjacent to the plasma generating region; and
   a plasma concentrating means adapted to reduce a size of the plasma processing region near the semiconductor device to be processed compared to a size of the plasma generating region, the plasma concentrating means including:

an electrode having a first length;

an insulating plate having a dome shape, and including a first part having a first radius of curvature and a second part having a second radius of curvature, which is smaller than the first radius of curvature, both of the first part and the second part face the plasma generating region; and a confinement layer connected to the second part of the insulating plate and extending toward the electrode, wherein a projected diameter of the second part of the insulating plate over the electrode is smaller than a projected diameter of the first part of the insulating plate, and equal to or larger than the first length of the electrode.

16. The apparatus as claimed in claim 15, wherein the confinement layer is substantially perpendicular to the projected length of the insulating plate.

17. The apparatus as claimed in claim 16, wherein the confinement layer is formed of a sidewall of the chamber.

18. The apparatus as claimed in claim 15, wherein the confinement layer forms an acute angle to a virtual plane connecting opposing ends of the insulating plate.

19. The apparatus as claimed in claim 15, wherein a center radius of curvature of the first part is at a different position than a center radius of curvature of the second part.

* * * * *